United States Patent
Einziger et al.

[19]

[11] Patent Number: 6,147,579

[45] Date of Patent: Nov. 14, 2000

[54] SUPERCONDUCTING MAGNET NON-UNIFORM THERMAL INSULATION BLANKETS

[75] Inventors: William Louis Einziger; Xianrui Huang; Gregory Alan Lehmann, all of Florence, S.C.; John Arthur Urbahn, Saratoga Springs, N.Y.

[73] Assignee: General Electric Company, Milwaukee, Wis.

[21] Appl. No.: 09/441,836

[22] Filed: Nov. 17, 1999

[51] Int. Cl.[7] ........................................ H01F 5/00
[52] U.S. Cl. ........................ 335/299; 335/216; 505/892
[58] Field of Search ........................... 335/216, 296–299, 335/300; 505/892, 897, 898; 324/318–321; 62/51.1

[56] References Cited

U.S. PATENT DOCUMENTS

| 5,651,256 | 7/1997 | Herd et al. | 62/51.1 |
| 6,002,315 | 12/1999 | Heiberger et al. | 335/216 |
| 6,011,454 | 1/2000 | Huang et al. | 335/216 |

*Primary Examiner*—Lincoln Donovan
*Assistant Examiner*—Tuyen Nguyen
*Attorney, Agent, or Firm*—Irving M. Freedman; Christian G. Cabou; Phyllis Y. Price

[57] ABSTRACT

A non-uniform multi-layer thermally insulating blanket assembly for use in a superconducting magnet in the tapered space between the thermal radiation shield and a conical support assembly includes three steps at different thicknesses provided by multiple blankets with layer staking and blanket positioning.

18 Claims, 4 Drawing Sheets

FIG_1

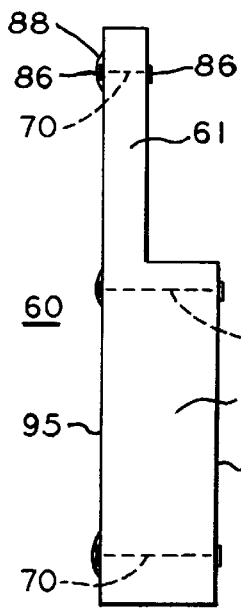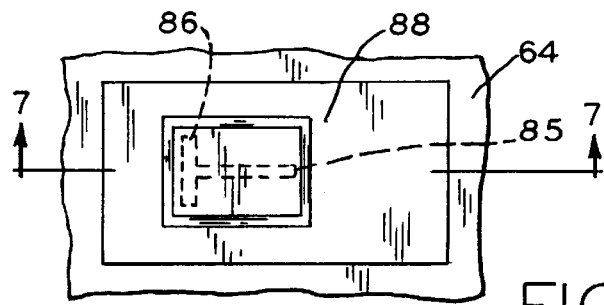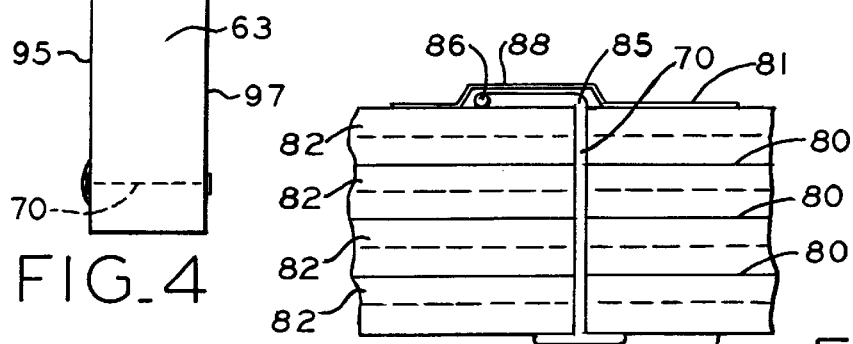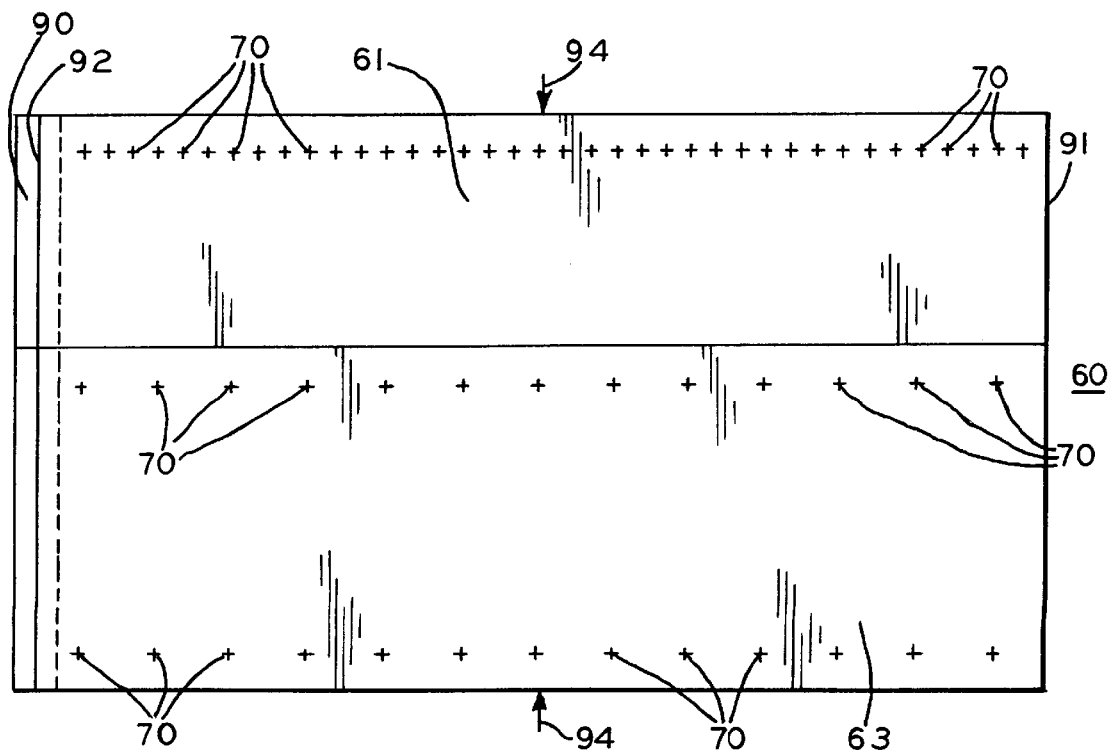

SUPERCONDUCTING MAGNET NON-UNIFORM THERMAL INSULATION BLANKETS

RELATED PATENT

This patent application is related to U.S. Pat. No. 6,011,454 assigned to the same assignee as the present invention.

BACKGROUND OF INVENTION

This invention relates to thermal insulation for the suspension system for a superconducting magnet assembly for a recondensing magnetic resonance imager (hereinafter called "MRI") and in particular to non-uniform multilayer insulation blankets for use in such magnet assemblies.

As is well known, a superconducting magnet can be made superconducting by placing it in an extremely cold environment, such as by enclosing it in a cryostat or pressure vessel containing liquid helium or other cryogen cryocoolant means. The extreme cold ensures that the magnet coils are superconducting, such that the coils can be operated in the persistent mode, that is when a power source is initially connected to the coil for a relatively short period of time to introduce a current flow through the coils and a superconducting switch is then closed, the current will continue to flow, thereby maintaining the large coil current and a magnetic imaging field. Superconducting magnets find wide application in the field of MRI.

Considerable research and development efforts have been directed at reducing magnet heat load and eliminating the need to continuously replenish the boiling liquid helium. While the use of liquid helium to provide cryogenic temperatures has been widely practiced and is satisfactory for MRI operation, the provision of a steady supply of liquid helium to MRI installations all over the world has proved to be difficult and costly. This has led to considerable effort being directed at superconducting materials and magnet structures in which the helium is recondensed and reused. This in turn leads to the need for good thermal insulation between the cryostat and the ambient temperature, a temperature difference in the order of over 400° F.

Another problem encountered by most MRI equipments is that they utilize solenoidal magnets enclosed in cylindrical structures with a central axial bore opening for patient access. However, in such an arrangement, the patient is practically enclosed in the warm bore, which can induce claustrophobia in some patients. The desirability of an open architecture structure in which the patient is not essentially totally enclosed has long been recognized. Unfortunately, an open architecture structure poses a number of technical problems and challenges. One problem is to provide a suitable support structure with insulation which occupies much less space than conventional support structures and insulation, and yet which nevertheless can support the magnet assembly under the considerable electromagnetic forces and thermal forces encountered during operation.

The suspension system of an MRI magnet has to support the magnet mass, while providing adequate stiffness with minimal conduction heat leak. In addition to the mass and its dynamic load, an open architecture MRI suspension must support a large electromagnetic (EM) net force in each half of the magnet in the axial direction as well as a possible transverse EM force due to misalignment. The stiffness requirement in all directions is also more demanding in such an assembly in order to provide field stability under vibration.

The support problem has been overcome by a dual conical tortuous generally Z-shaped lengthened thermal path as discussed in more detail in the aformentioned related United States patent. However, such structures leave very little space between the warm suspension component and the cold thermal shield in which to position thermally insulation since the space varies from only ~0.020 inches to ~0.5". A preferred multi-layer insulation (hereinafter called "MLI") is thermal blankets which utilize alternating layers of a low conductivity spacer material between double sided aluminized mylar layers. However, in general, in the temperature range between 300K and 50K the performance of MLI blankets increases with the number of such layers. In fact, within that temperature range, it has been shown that even a few layers of MLI is better than using no MLI at all. However, performance of the MLI blanket is severely degraded due to increased heat transfer from direct conduction if the layers are compressed. This precludes installing blankets that have a natural or normal loft thickness greater than the space available. In addition, it is important to be able to properly position and retain in position such MLI blanket insulation.

Good heat interception in the suspension is essential to bring the 4 K heat load within the cooling capacity of the magnet, particularly if helium recondensing is provided since the mechanical cryocooler in a recondensing system is frequently at, or near, its cooling capacity.

All of the overlapping and conflicting requirements must be satisfied for a practical and satisfactory open architecture MRI superconducting magnet structure of the type described.

SUMMARY OF INVENTION

Thus, there is a particular need for a superconducting magnet thermally insulating assembly which overcomes the aforementioned problems while facilitating installation and retention of the thermal assembly in the proper position within the superconducting magnet In accordance with one form of the invention the tapered spaces between the support members supporting the spaced vacuum vessel, the thermal radiation shield and the cryogen vessel of a superconducting magnet is thermally insulated using a multi-step non-uniform MLI blanket assembly. The blanket assembly is staked to the thermal radiation shield by non-conductive stakes which do not compress the non-uniform blankets. Additional thickness is obtained by staking a uniform thickness MLI blanket to the non-uniform thickness MLI blanket in the wider end region. The seams of the MLI blankets are offset 90–270° apart and are covered with a low emissivity thermally reflective tape. The top and bottom layers of the non-uniform MLI blanket is of increased thickness to assist in positioning and supporting the MLI blanket assembly on the thermal radiation shield.

BRIEF DESCRIPTION OF DRAWINGS

FIG. 4 is a view showing details of the MLI blanket used in FIG. 3 prior to assembly.

FIG. 5 is a side view of FIG. 4.

FIG. 6 is an enlarged cross-section view of one of the stakes used in FIGS. 4 and 5.

FIG. 7 is a top view of FIG. 6.

DETAILED DESCRIPTION OF PREFERRED EMBODIMENTS OF INVENTION

Figure 1:
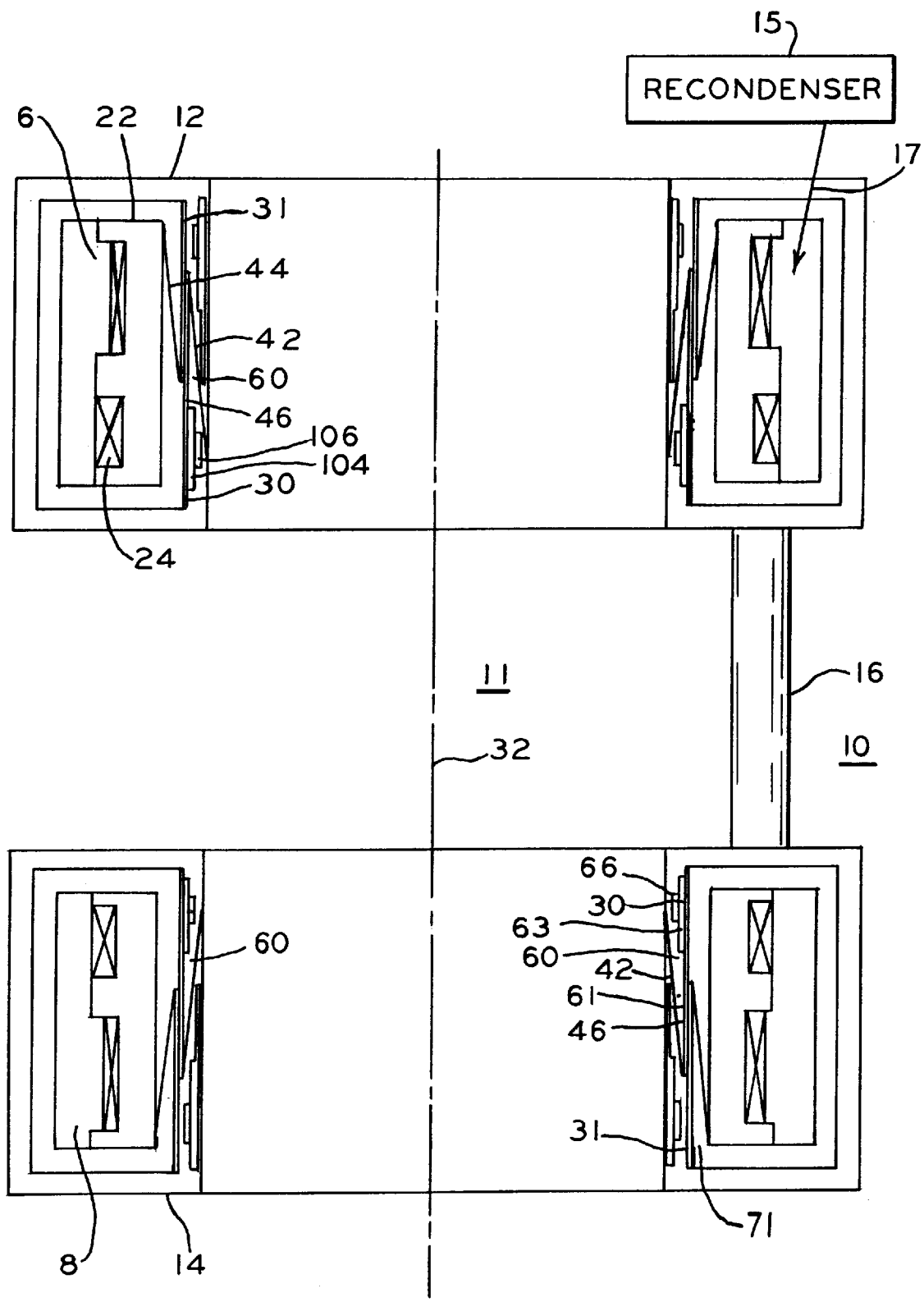
FIG. 1 is a simplified side view, partially cut away, of an open architecture superconducting magnet assembly incorporating the invention.
Figure 2:
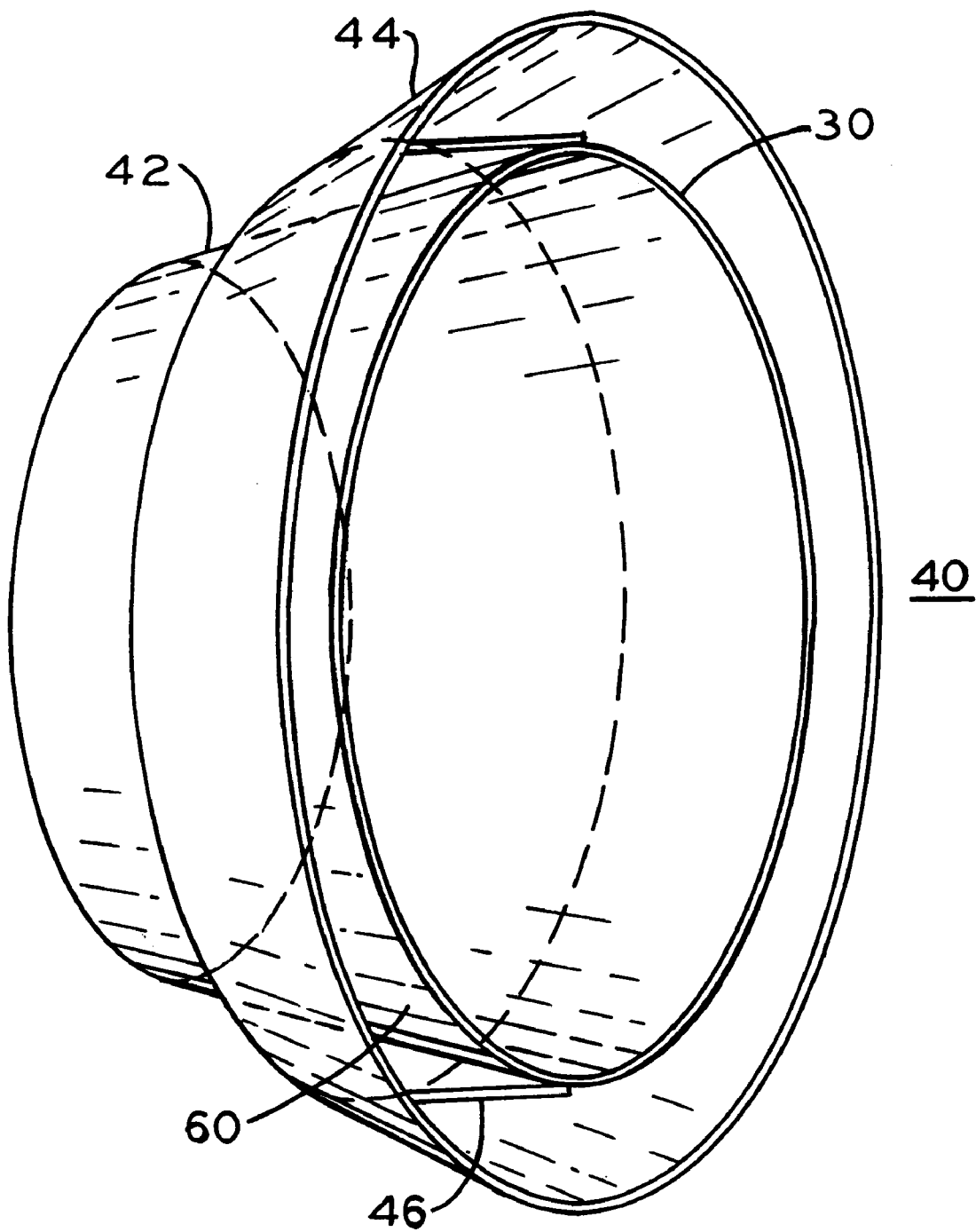
FIG. 2 is an enlarged simplified perspective view of the support structure of FIG. 1 which is not to scale in order to better illustrate the tapered support system.

Referring first to FIGS. 1 and 2, open architecture superconducting magnet assembly 10 includes a pair of separated solenoidal or cylindrical shaped vacuum vessels or housings 12 or 14 of superconducting magnets 6 and 8 separated by support and interconnect assembly 16. The overall structure formed by vacuum vessels 12 and 14 and support 16 provides substantial openings, or open space, between the vacuum vessels which avoids enclosure of the patient positioned in the open space or imaging region 11 around axis 32 of superconducting magnets 6 and 8. Increasing the open space minimizes the space available within the vacuum vessels. A plurality of main magnet coils shown generally as 24 within cryogen pressure vessel 22 of superconducting magnet 6 provide a strong magnetic field in imaging region 11 upon cooling of magnet assembly 10 to superconducting temperatures (by conventional helium cooling means—not shown) and the initiation of superconducting magnet current flow. Recondenser 15 recondenses helium gas resulting from the boiling of helium in cooling superconducting magnets 6 and 8 to superconducting temperatures. The recondensed liquid helium flows back as indicated by arrow 17 to the superconducting magnets in a manner well known in the art.

It is important that the magnet support system connecting between cryogen pressure vessel 22, thermal radiation shield 30 and vacuum vessel 12 have a large thermal resistance between the cryogen vessel and the very much warmer (as much as over 300 K) exterior atmosphere outside superconducting magnet assembly 10. Carbon fiber reinforced composite (hereinafter called "CFRP") provides strength and thermal isolation and resistance to heat conduction in the limited radial space within vacuum vessel 12. Generally conical shaped CFRP support assembly 40 includes 3 sections. A first generally frustro-conical or conical section 42 extends between cryogen pressure vessel 22 and thermal radiation shield 30, a second overlapping generally frustro-conical or conical section 44 connects thermal shield 30 and vacuum vessel 12, and a third or reentry section 46 connects between conical sections 42 and 44. Reentry section 46 is substantially cylindrical and concentric about axis 11 at angles to the conical sections forming angular openings 50 and 51. Frustro-conical section or member 42 is attached to, extends between, and supports the spaced positioning of cryogen pressure vessel 22, radiation shield 30 and vacuum vessel 12.

CFRP support assembly 40 and sections 42, 44 and 46 are wound and assembled together to form a unitary assembly or member as best illustrated in FIG. 2. The intermediate cylindrical reentrant cylinder 46 lengthens the thermal path of support assembly 40 and uses the same CFRP material to match the thermal shrinkage of suspension cones 42 and 44. As a result, CFRP support assembly 40 not only provides great strength in both the axial and radial directions, it also provides a lengthened generally Z-shaped thermal path which resists thermal conductivity which might otherwise occur because of the relatively short distance between cryogen pressure vessel 22 and vacuum vessel 12 within the confines of the open architecture superconducting magnets 6 and 8. However, such structure leaves very little internal space in which to position MLI blankets to increase thermal insulation to adequately relieve the thermal demands on recondenser 15.

Figure 3:
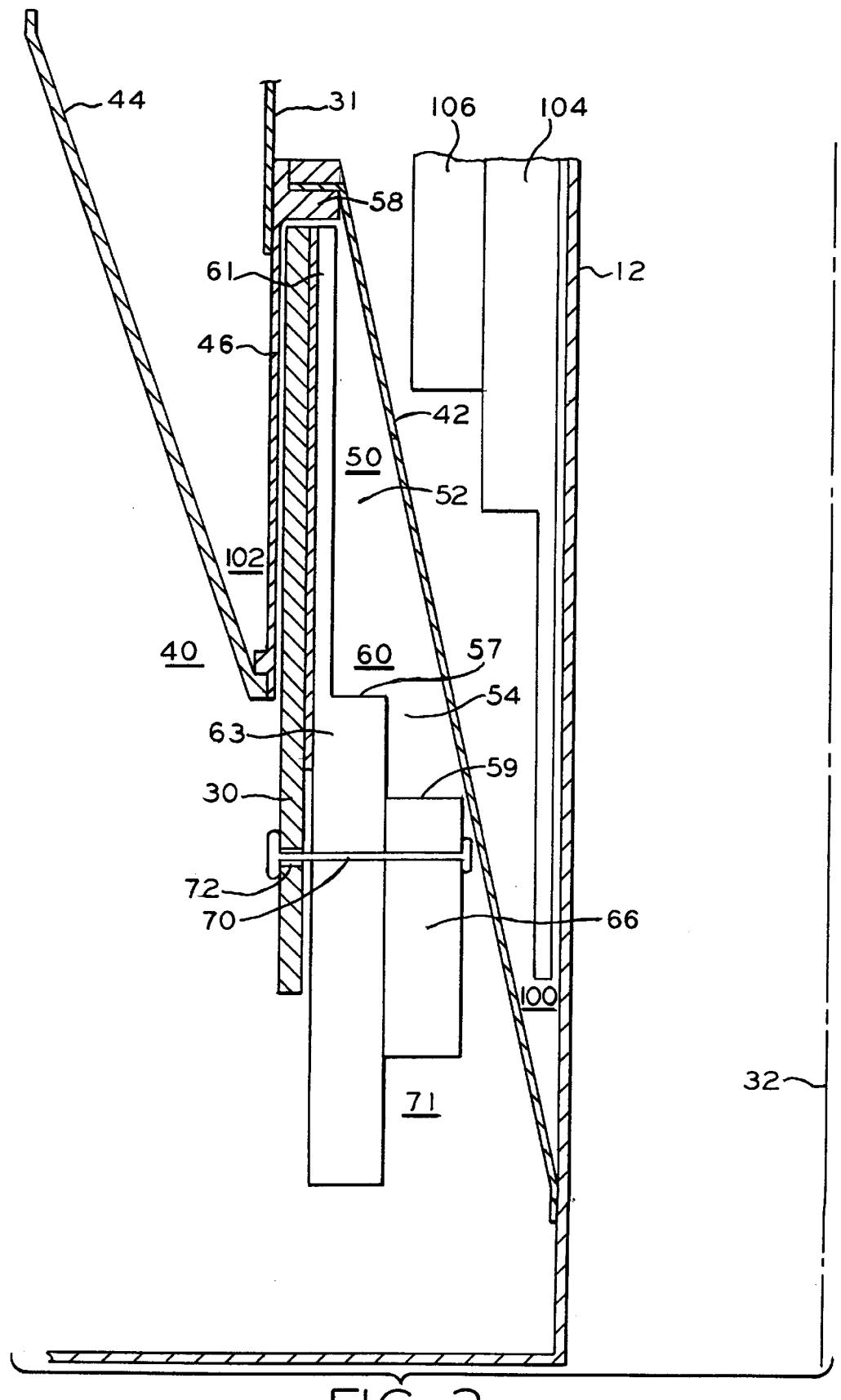
FIG. 3 is a cross section including details of the support structure of FIGS. 1 and 2 showing details of the positioning of the insulating blankets.

Referring next to FIG. 3, non-uniform MLI cold blanket 60 is positioned between first conical section 42 and radiation shield 30 in tapered space 50 therebetween. Tapered space 50 increases in size from narrower end region 52 in the region remote from imaging region 11 (see FIG. 1) toward wider end region 54. It is to be noted that MLI blanket 60 is thicker in wider end region 54 than in narrower end region 52, with a first thickness step or rise 57, providing two separate regions of different uniform thicknesses, namely upper portion 61 in the narrowest portion of tapered space 50 and lower portion 63. A second MLI warm blanket 66 of uniform thickness is positioned within wider end region 54 and is staked to MLI blanket 60 by a plurality of stakes such as 70 which pass through the blankets and also apertures 72 in radiation shield 30 to secure the MLI blankets in position within tapered space 50. The additional uniform blanket thickness provided by blanket 66 transitions at second thickness or rise 59.

It has been found that the thermal insulating performance of MLI blankets is severely degraded when the blanket is compressed. It is believed that moving the layers closer together increases the direct heat conduction. One goal thus becomes the placing of as many layers of MLI blanket as practicable within the space available without any compression of the MLI blankets. This is expressed as maintaining the natural or normal loft thickness of the uncompressed MLI blankets. Stakes 70 are accordingly applied with sufficient length to avoid compression of MLI blankets 60 and 66. MLI blankets 60 and 66 are thus wound around aluminum cylindrical thermal radiation shield 30 meeting at a seam which is sealed or joined by low emissivity tape tabs as described below. The resultant non-uniform MLI blanket assembly thus includes three steps or regions of uniform thicknesses providing stepped increasing thickness. Upper aluminum thermal radiation shield 31 extends outside tapered space 50 beyond assembly ring 58.

The first step or thinnest portion 61 of blanket assembly 71 includes 5 layers of thermally reflective aluminized mylar separated by insulation while second step 63 includes a total of 20 layers of aluminized mylar and third step 63, 66 includes an addition 20 layers or a total of 40 layers of aluminized mylar. The specific number of layers in each step and the number of steps is dependent on the available space in tapered space 50.

Details of MLI blankets 60 and 66 are shown in FIGS. 4–7. Referring to first to FIGS. 4 and 5, it is seen that MLI blanket 60 includes 2 steps, thinner portion 61 of 5 layers of aluminized mylar 80 separated by low conductivity spacer layers 82 of polyester mesh or spun bonded or other suitable spacer material which is best shown in FIG. 7. A plurality of stakes or tag pin fasteners 70 of non-conductive material such as Nylon pass through MLI blankets 60 and 66 to maintain the positioning of the layer and the blankets on radiation shield 30 as best shown in FIG. 3. Stakes 70 may be similar to the "T" bar stakes used in the clothing industry enabling their application with tools similar to those used in the clothing industry.

As best shown in FIG. 5, there are 3 rows of stakes 70 extend across and through MLI blanket 60. The upper row of thirty-eight stakes 70 pass through thinner portion 61 of MLI blanket 60, while the middle and bottom rows of thirteen stakes 70 pass through thicker portion 63. Stakes 70 on FIG. 5 are not shown to scale but do illustrate that they are equally spaced around MLI blanket 60. In one embodiment stakes 70 are 0.38 basting gun tacks for which Dritz model 408 basting gun is suitable for their application. Care should be taken to avoid compression of the MLI blankets when applying the stakes which in one embodiment have heads or ends 86 which are T-shaped as best shown in FIGS. 6 and 7.

FIGS. 6 and 7 illustrate one application of stakes 70 on thinner portion 61 of MLI blanket 60. Stakes 70 may be longer than needed, particularly if commercially available stakes are used. Stakes 70 should be equal to, or slightly greater than, the natural loft thickness of the MLI blanket to secure yet prevent local compression of the MLI blankets in the vicinity of the stakes. If commercially available stakes 70 are too long to properly stake the blanket layers together they may be bent 85 over top layer 81 of aluminized mylar as shown in FIGS. 6 and 7. Bent over stakes 70 are then covered by low emissivity tape 88. It is to be appreciated that, as noted above, the space available in tapered space 50, is quite small.

While MLI blanket 60 is shown flat in FIG. 5, when installed in tapered space 50 on radiation shield 30 (as shown in FIG. 3) they form a cylinder around the radiation shield and axis 32 meeting at seams which are covered with low emissivity tape 90 as shown applied in FIG. 5 and underlying one edge 92 of the MLI blanket. Tape 90 may be self adhesive tape to cover the joint formed by edges 90 and 91 of MLI blanket 60 when MLI blanket 60 is installed around radiation shield 30.

In order to avoid any direct thermal path, and notwithstanding tape 90, the seam formed by the ends of uniform MLI blanket 66 when positioned over stepped blanket 60 is offset from the seam 90, 91 formed by the ends or edges of MLI blanket 60. The offset is in the range of 90–270° and is illustrated schematically in FIG. 5 with the seam offset indicated by arrows 94 being 180°.

In determining the thickness of steps 61, 63 and 63, 66 the thermal contraction of MLI thermal blankets 60 and 66, the thermal contraction of suspension 40 components, and of radiation shield 30 is analytically calculated to insure that while superconducting magnet assembly 10 is at field or in superconducting operation the MLI blankets will fill as much of tapered space 50 as possible without compression of layers 80, 81, 82, 83 of the MLI blankets. Compression of MLI blankets 60 and 66 moves thermally reflective layers 80, 81, 83 closer together providing a more direct thermal path, and counters the thermal effectiveness of natural loft thickness MLI blankets. As a result, the amount of space in tapered space 50 not filled with an MLI blanket will be less than that shown in FIG. 3, particularly when superconducting magnet 10 is cooled to superconducting temperatures. The spacing in FIG. 3 is not shown to scale in order to better illustrate the subject invention.

To assist in providing support for mounting MLI blankets 60, 66 on radiation shield 30 in tapered space 50, the outer layers of aluminized mylar indicated as 95 and 97 on FIG. 4 may be thicker than the remainder of the aluminized mylar layers. In one embodiment layers 95 and 97 are thicker or of heavier gauge, namely 0.005" and 0.001" mylar, respectively, while the remaining 18 layers are 0.00025" mylar. Pinning the two MLI blankets 60 and 66 to radiation shield 30 by 26 equally spaced stakes 70 maintains the spatial integrity of the multi-layer blankets regardless of orientation. MLI non-uniform stepped cold blanket 60 is closer to cryogen vessel 22 than warm uniform MLI blanket 66.

The components of both superconducting magnets 6 and 8 are similar, notwithstanding that for simplicity of illustration all of the corresponding components in both magnets have not been identified. To the extent that additional insulation is desired or required, an additional multi-layer non-uniform multi-blanket insulation assembly can be provided in tapered space 100 between CFRP support assembly 40 and evacuated vessel 12, or if desired or required, in tapered to space 102 between reentrant cylinder 46 and suspension cone 44. An additional multi-layer non-uniform multi-blanket insulation assembly 104, 106 similar to MLI blankets 60, 66 assembly is shown in FIG. 3 positioned in tapered space 100 on vacuum vessel 12.

While the present invention has been described with respect to certain preferred embodiments thereof, it is to be understood that numerous variations and the details of construction, the arrangement and combination of parts, and the type of material used may be made without departing from the spirit and scope of the invention.

What is claimed is:

1. A thermally insulating superconducting magnet having an axis and suitable for magnetic resonance imaging and including a cryogen pressure vessel concentric within and spaced from a vacuum vessel, and a thermal radiation shield interposed between the vessels and extending along the axis thereof, and a suspension system to maintain the positions of the vessels and the thermal radiation shield concentrically about said axis comprising:

a support extending at an angle to said axis between said cryogen pressure vessel and said radiation shield around said thermal radiation shield and forming a space therebetween which increases along said axis defining a frustro-conical surface;

a non-uniform thickness thermal insulation assembly interposed between said support and said thermal radiation shield including:

a first multi-layer thermal insulating blanket of alternating layers of low thermal conductivity spacers and thermally reflective material;

a second multi-layer insulating blanket overlying a portion of said first multi-layer insulating blanket forming a non-uniform stepped thickness;

the number of layers in said multi-layer thermal insulating blanket being greater in the region of said space remote from said radiation shield and the apex of said angle forming a non-uniform thickness in said space; and at least one fastener passing through and securing the multi-layer thermal blankets within said space between said support and said thermal radiation shield.

2. The thermally insulated superconducting magnet of claim 1 wherein said at least one fastener is a plurality of low thermal conductivity stakes which pass through said thermal radiation shield and said multi-layer thermal blankets securing said multi-layer thermal blankets to said thermal radiation shield.

3. The thermally insulated superconducting magnet of claim 2 wherein said multi-layer blanket includes ends surrounds said radiation shield with said ends thereof meeting at a seam, and said seam is covered by a layer of thermally reflective material.

4. The thermally insulated superconducting magnet of claim 2 further including at least one additional multi-layer blanket which is of uniform thickness and overlies said first multi-layer thermal insulating blanket in said region of said space where said support is further away from said radiation shield forming at least one additional non-uniform thickness step in said thermal insulation assembly.

5. The thermally insulated superconducting magnet of claim 4 wherein at least some of said stakes pass through the first and second multi-layer thermal blankets and also through said additional multi-layer blanket.

6. The thermally insulated superconducting magnet of claim 5 wherein said support is carbon fiber reinforced composite.

7. The thermally insulated superconducting magnet of claim 6 wherein all of said multi-layer blankets surround said radiation shield each meeting at seams which are offset from each other.

8. The thermally insulated superconducting magnet of claim 7 wherein the offset between adjacent blankets is in the range of 90–270° around said axis said thermal radiation shield.

9. The thermally insulated superconducting magnet of claim 1 wherein the thickness of said the first and second multi-layer thermal insulating blankets are selected to fill said space without compression of said layers.

10. The thermally insulated superconducting magnet of claim 9 wherein one end of said low thermal conductivity stakes are inserted through the layers of said first multi-layer thermal insulating blanket and the ends thereof bent over and covered with low emissivity tape.

11. Non-uniform multi-layer insulation for a tapered space in a superconducting magnet having an axis and suitable for magnetic resonance imaging and including a cylindrical cryogen pressure vessel within a vacuum vessel and concentric about the axis thereof, a thermal radiation shield interposed between the vessels and extending along said axis, thereof and a conical suspension system to position and maintain the spaced relationship between the cryogen pressure vessel and the thermal radiation shield forming a tapered space therebetween with a narrower end region and a wider end region; the non-uniform multi-layer insulation comprising:

a non-uniform multi-layer insulating blanket positioned in said space;

said non-uniform multi-layer insulating blanket including alternating layers of low thermal conductivity spacers and a thermal reflective layer;

said non-uniform multi-layer including fewer layers in the narrower end region of said tapered space than in the wider end region of said space forming a difference of thickness step therebetween;

a plurality of separated stakes extending through said non-uniform multi-layer insulating blanket;

at least some of said stakes also extending through said radiation shield to maintain said non-uniform multi-layer insulating blanket positioned on said thermal radiation shield.

12. The non-uniform multi-layer insulation of claim 11 wherein the multiple layers of said multi-layer insulating blanket are not compressed in said space.

13. The non-uniform multi-layer insulation in a superconducting magnet of claim 11 wherein at least one additional uniform multi-layer thermal insulating blanket is positioned adjacent a portion of said non-uniform multi-layer insulating blanket in the wider portion of said tapered space forming at least a second step and some said plurality of separated stakes extend through both of said multi-layer blankets.

14. The non-uniform multi-layer insulation in a superconducting magnet of claim 13 wherein there are 4 times as many reflective layers in the region remote from said fewer layers of said non-uniform multi-layer insulating blanket as in the fewer layers region of said non-uniform multi-layer insulating blanket.

15. The non-uniform multi-layer insulation in a superconducting magnet of claim 14 wherein the ends of said stakes which pass through said fewer layer region of said multi-layer insulating blanket, are bent over and covered with reflective tape.

16. The non-uniform multi-layer insulation in a superconducting magnet of claim 13 wherein the multi-layer insulating blankets of said non-uniform multi-layer insulation meet in seams with said seams being offset from each other, and said seams are covered by low emissivity tape.

17. The non-uniform multi-layer insulation in a superconducting magnet of claim 13 wherein the reflective layers of said non-uniform multi-layers insulating blanket remote from said axis are thicker than reflective layers closer to the center of said axis.

18. The non-uniform multi-layer insulation in a superconducting magnet of claim 14 wherein a second assembly of a first and additional multilayer insulating blankets is positioned in the tapered space formed by said suspension system between said radiation shield and said vacuum vessel.

* * * * *